United States Patent [19]

Wegmann et al.

[11] Patent Number: 5,003,151
[45] Date of Patent: Mar. 26, 1991

[54] METHOD AND CONTROL ARRANGEMENT FOR THE EVAPORATION RATE OF AN ELECTRON BEAM

[75] Inventors: Urs Wegmann; Signer Hans, both of Oberschan; Albert Koller, Sargans, all of Switzerland

[73] Assignee: Balzers Aktiengesellschaft, Liechtenstein

[21] Appl. No.: 433,609

[22] Filed: Nov. 8, 1989

[30] Foreign Application Priority Data

Nov. 10, 1988 [CH] Switzerland .................. 4172/88

[51] Int. Cl.$^5$ ............................................ B23K 15/00
[52] U.S. Cl. .......................... 219/121.17; 219/121.16; 219/121.35
[58] Field of Search ............... 219/121.16, 121.17, 219/121.35; 250/492.1, 492.3

[56] References Cited

U.S. PATENT DOCUMENTS 3,607,222 9/1971 Kennedy .................. 219/121.28
3,875,416 4/1975 Spicer ...................... 219/121.29

FOREIGN PATENT DOCUMENTS 0104922 4/1984 European Pat. Off. .
0222219 5/1987 European Pat. Off. .
3428802 2/1986 Fed. Rep. of Germany .
2586720 2/1986 France .

Primary Examiner—C. L. Albritton
Attorney, Agent, or Firm—Louis Weinstein

[57] ABSTRACT

The average evaporation rate over a predetermined area to be evaporated is controlled by moving an electron beam over said area wherein one characteristic of the electron beam is controlled in order to influence the evaporation rate. The electron beam is moved along a path according to stored maps wherein each position to which the electron beam is moved has assigned thereto substantially equal control values. In a first technique, each of the individual stored maps are selected in a sequential fashion to minimize the number of changes in the control value during a complete scan of the area being evaporated. In another technique, the control value of a predetermined position is compared against a predetermined number of stored control values, which is preferably all of the control values stored in a memory. The position data having associated control values which differ from the control value of the predetermined position by a predetermined minimal amount are stored as a map and thereafter utilized to control the electron beam so that the characteristic of the electron beam being controlled is maintained substantially constant for all of those positions stored as a map. In still another technique, a plurality of maps are stored in a memory, each map comprising position data whose associated control values are substantially equal and wherein two or more of said maps are selected and the control values of the maps associated with the same position are combined to control a characteristic of the beam.

23 Claims, 6 Drawing Sheets

INTERSECTION OPERATOR: $\pi$

INTERSECTION OPERATOR: $\Sigma$

METHOD AND CONTROL ARRANGEMENT FOR THE EVAPORATION RATE OF AN ELECTRON BEAM

FIELD OF THE INVENTION

The present invention is directed to a method for controlling the average evaporation rate which is produced by an electron beam moved over a predetermined area to be evaporated, so as to result in a predetermined distribution of evaporation rate over said area.

BACKGROUND OF THE INVENTION

From the EP A-0 104 922 it is known to control a fine, low-power electron beam of a lithographic apparatus according to a computer stored map across the area of an integrated circuit to picture a pattern thereon.

Of said stored map, regions which will necessitate smaller accuracy of picturing are separated from regions necessitating higher picturing accuracy. The electron beam is moved with constant cross-sectional area over the surface areas of said integrated circuit which necessitate the same picturing accuracy. Thus, the cross-sectional area of the beam need not be changed at all subsequent beam positions.

An integrated circuit surface presents a small, flat and time-constant working surface for the electron beam for a lithographic process which electron beam has thus only to be deflected by small angles. Further, the effect of the electron beam impinging on said integrated circuit surface, is clearly predeterminable, the beam impinges normally once on every IC-area to be patterned.

In contrast thereto, the present invention is directed to evaporation of an area which presents a large, unsteady profile and an evaporation surface varying in time. In the inventive context, the electron beam must be deflected by relatively large angles according to the relatively large area to be evaporated and, to provide for an evaporation of material of said area, the electron beam has to be a relatively high-powered electron beam. Further, the instantaneous effect of the electron beam on the area to be evaporated is practically not predictable, due to the most complex and time varying structure of the surface being evaporated.

From the German laid-open print 3 428 802 a method for controlling the average evaporation rate as mentioned above is known, wherein there is assigned to the predetermined area to be evaporated a map with a position pattern for the electron beam. The electron beam is moved step by step from one position to the other according to the positions of the pattern of the map. Each position element of the position pattern which becomes controlling the electron beam position during its scanning work across the area to be evaporated, has assigned to it its proper control or correction value, influencing an operating parameter for the electron beam which influences the instantaneous evaporation rate of the beam on the predetermined area. Thus, the number of elements of the position pattern equals the number of control values which are assigned to the elements of the position pattern. The control values assigned to the respective position elements of the position pattern thus form together a control value pattern which is assigned to the predetermined area to be evaporated. With these correction values operating parameters of the electron beam are controlled, as e.g. the time during which the electron beam holds a predetermined position which is defined by an element of said position pattern or e.g. the focus of the beam at such a position or e.g. the power of the electron beam at such a position.

To set the proper correction values assigned to every element of the position pattern, the evaporation plant is calibrated and thereby the control values are adjusted, so that finally a desired evaporation rate distribution results across the entire area to be evaporated. Reaching of such a predetermined and desired evaporation rate distribution is necessary to evaporate a predetermined material according to predetermined criteria, so e.g. everywhere equally within a vacuum evaporation chamber of the plant.

This known method has the following disadvantages:

The calibration process of the plant is very time-consuming, because for each element of the position pattern the respective correction value must be evaluated.

Further, the storage amount is very large, because every correction value is to be stored, the number of which according to the number of position elements of the position pattern.

Further, such a beam control process becomes normally relatively slow, because at every change of position of the electron beam from one position pattern element to another, the new correction value according to the new position element must at least be read from the store and must possibly become active on the electron beam control. The new correction value must be read from the store in every case, even if it later turns out that the new correction value has the same value as the correction value which is effective at the instantaneous beam position.

BRIEF DESCRIPTION AND OBJECTS OF THE INVENTION

It is an object of the present invention to eliminate the said drawbacks. This is inventively realized by providing a method for controlling the average evaporation rate which is produced by an electron beam moved over a predetermined area to be evaporated, so as to result in a predetermined distribution of evaporation rate over said area, comprising the steps of:
 assigning to said predetermined area at least two maps with a position pattern each, said position patterns of said at least two maps being assigned to at least a substantial part of said predetermined area,
 assigning to every position of said position patterns of said at least two maps a correction value, so as to form a correction value pattern assigned to said position patterns of said at least two maps,
 selecting said correction values to be equal for all positions of the position pattern of respective ones of said two maps,
 generating from said correction values assigned to every position of said position patterns of said at least two maps control values for every position of said position patterns,
 moving said beam from position to position on said predetermined area which positions are assigned to said positions of said position patterns of said at least two maps,
 controlling at least one operating parameter of said electron beam influencing the instantaneous evaporation rate of said electron beam on said predetermined area with said control values, according to its instantaneous position on said predetermined area assigned to an instantaneous position of said position patterns of said at least two maps.

Thereby an important feature is realized that the same constant correction value is assigned to a multitude of electron beam positions with respect to the area to be evaporated, and that it is a priori known which positions have the same correction value assigned to. Thus, the effort at calibration of the plant is substantially reduced, because for sub-areas of said area to be evaporated and according to respective one of the maps there is only one correction value to be evaluated, i.e. every of said at least two maps has one correction value assigned to it.

Nevertheless, it must be pointed out that due to the complexity of the evaporation process, a calibration e.g. for predetermined materials to be evaporated and/or according to different shapes of said area to be evaporated, remains necessary. After calibration the values for the specific cases for which calibration was performed, are known and are used for subsequent evaporation processes of the same kind as calibrated.

Accordingly, the amount of storage for the correction values of the correction value pattern is significantly reduced and the control process becomes significantly faster because the correction value may be kept constant without reading from the store as long as the electron beam position remains in a position on the area to be evaporated which is assigned to the same map.

Thus, one must only detect as to when the beam position crosses the limit of a map to pass onto a position assigned to another map. Only in this case the new correction value is to be read out.

Principally, the present invention thus departs from the recognition that it is not necessary within a position pattern of equally distributed position elements across the area to be evaporated, to assign to each position element operating parameter correction values for the electron beam.

Physical conditions which lead to the fact that the electron beam generates an evaporation rate distribution which does not accord with a desired one, especially with a uniform distribution, if the electron beam is controlled with position-independent, constant operating parameters are not different for every position of the beam or, respectively, for every element of the position pattern.

Thus, e.g. exterior cooling of the area to be evaporated may lead to the fact that the heat distribution along the area to be evaporated may be defined by isothermal lines which are closed-loop. On such lines the same thermal conditions will be encountered, so that along such lines the same correction values may be applied as concerns thermal disturbance.

Analogically, positions of the beam at which the beam deflection or its focussing lead to the same evaporating effect may be linked by such "equi-effect" lines, thus resulting in a representation of the area to be evaporated, subdivided in areas—according to the "maps" mentioned—which have to be equally treated.

Departing from this recognition and primarily based on considerations of physical influences on the effect of the electron beam on the material to be evaporated, there is thus realized at least one correction value pattern which, similar to a geographic map or relief, comprises at least two maps with a multitude of electron beam position elements and to which single maps—and not position elements—there is assigned one correction value, so that the above mentioned drawbacks are eliminated.

It is a further object of the invention to provide for utmost flexibility in considering different disturbing effects which lead to an evaporation rate distribution different from a desired one.

This is achieved by further assigning to at least a part of said predetermined area at least two super-imposed of said maps so that a position of said part of said predetermined area is assigned to a position of said position patterns of said at least two super-imposed of said at least two maps, generating said control value by calculation from correction values assigned to the same position of said position patterns of said super-imposed of said at least two maps.

Thereby several correction values/position maps, each provided with a respective position element pattern, are provided, e.g. for single physical influences as mentioned above. The control value pattern which finally controls the at least one operating parameter of the beam as, and preferably, its holding time at a position and/or its focussing or power, is generated by calculation departing from the correction values of superimposed maps, these maps being assigned, at least partly, to the same beam positions, thus containing, at least partly, position elements assigned to the same beam position.

Thus, the entire control value pattern is realized by calculatingly combining the single correction values of the number of superimposed maps which is provided.

If at least two such superimposed maps are provided, there is proposed to selectively combine a desired number of correction values from the according number of such maps to finally calculate the control value for the at least one operating parameter of the electron beam.

The electron beam may be moved, as is well-known up to now, in a predetermined trajectory propagating from one position element of the position pattern to the next position element which movement control results, as the elements of the pattern are reduced in size, finally into a continuous movement control of the beam along its trajectory.

It is a further object of the invention to further improve process speed.

This is realized in one embodiment of the invention by having the movement of the beam so controlled, that it crosses borders of maps to which respective constant correction values are assigned as seldom as possible, so as not to lead to an adjustment of the operating parameter control more than is absolutely necessary. This leads especially then to an improvement of process speed if due to the system the step response of the electron beam on a step of a control value shows a relatively long transient time-span.

Process speed may further be improved in that the beam is moved from one position to a next position, so that such a change in position results in a minimum change of control values assigned to said two positions considered.

It is a further object of the present invention to allow for individual adaption of a plant. After the control process was installed and the correction value patterns were assigned to the position maps, individual needs of a user are therefore considered without a complete readjustment of the map distribution and of the correction values assigned thereto at installation, in that the position patterns assigned to the predetermined area to be evaporated are predetermined and further the maps with their constant correction values, but the correction values themselves may be individually adjusted for the exact specific and individual need. Thereby it must be emphasized that individual adjustment of the correction values may only be done for every map, so that considered at a correction value pattern resulting from several superimposed maps, the value-profile of such a combined correction value pattern may be adjusted, maintaining constant correction values over all position elements of each single map.

When making use of the above described method, in which the electron beam is moved following minimum control value differences from position to position, a multi-valued map configuration, e.g. occurring at un-linked maps with equal control values, may lead to an undefined forth and backward jumping of the beam from one position belonging to one map to another position belonging to the other map. This may be avoided by controlling the movement of the beam according to a minimal control-value gradient or according to minimal control value differences from a position element according to an instantaneous beam position on the predetermined area, to a position according to an adjacent position element.

The inventive control arrangement for controlling the evaporation rate of an electron beam on a predetermined area to be evaporated in an evaporation plant, said arrangement comprising a deflection control unit for said beam, generating position identification signals for the position of said beam on said predetermined area, storage means for storing correction values for at least one operating parameter of said beam influencing the evaporation rate of said beam on said predetermined area, assigning means assigning at least a part of said correction values identically to identification signals identifying at least two distinct positions of said beam on said predetermined area, said position identification signals being led to a position control unit for said beam, whereas said correction values being led to a control input for controlling said at least one operating parameter of said beam influencing the evaporating action of said beam on said area to be evaporated.

The deflection control unit thereby generates position identification signals which define beam positions on said area which are still to be evaporated.

If a predetermined trajectory is given for the beam along said area, said deflection control unit identifies positions for the beam according to such a trajectory.

If the beam is moved according to an automatic procedure "search for minimum control value differences", as was mentioned above, the beam positions first identified by the deflection control unit is not necessarily the position which will be worked next. In this case and as will be explained below, a multitude or at least the adjacent positions to an instantaneous beam position are first identified, from which the next position is selected according to the said minimum control value criterium.

There are further provided storage means for storing correction values for at least one operating parameter of the beam, as well as assigning means which assign to several beam positions the same storage location from said storage means with one correction value stored therein. Thus, and as was explained above, for several beam positions, be it of a predetermined beam trajectory or of an automatically searched optimalized beam trajectory, correction value maps with respective constant correction values are defined.

The correction values output from said storage means act as control values on at least one control input of a control unit for the at least one beam operating parameter. Such an operating parameter control input is preferably an input for controlling the time-span during which the beam remains stationary at one location and/or a control input for the beam focus and/or a control input for the power of the beam.

The deflection control unit finally leads the beam into the next position on the area to be evaporated. This next position is either a predetermined position—for a beam movement control along a predetermined trajectory—or accords to a position which was automatically evaluated as by calculation and selection.

To consider different physical influences on the evaporation by the beam of said predetermined area, several storage means for correction values are preferably provided, whereby the assigning means assign to one respective beam position storage locations of at least a selected number of these several storage means.

The correction values out of these selected number of storage means are combined to finally result in a composite control value assigned to said beam position considered.

BRIEF DESCRIPTION OF THE FIGURES

The invention will now be described by way of preferred examples and with the help of the figures.

The figures show.

DETAILED DESCRIPTION OF THE INVENTION AND PREFERRED EMBODIMENTS THEREOF

Figure 1:
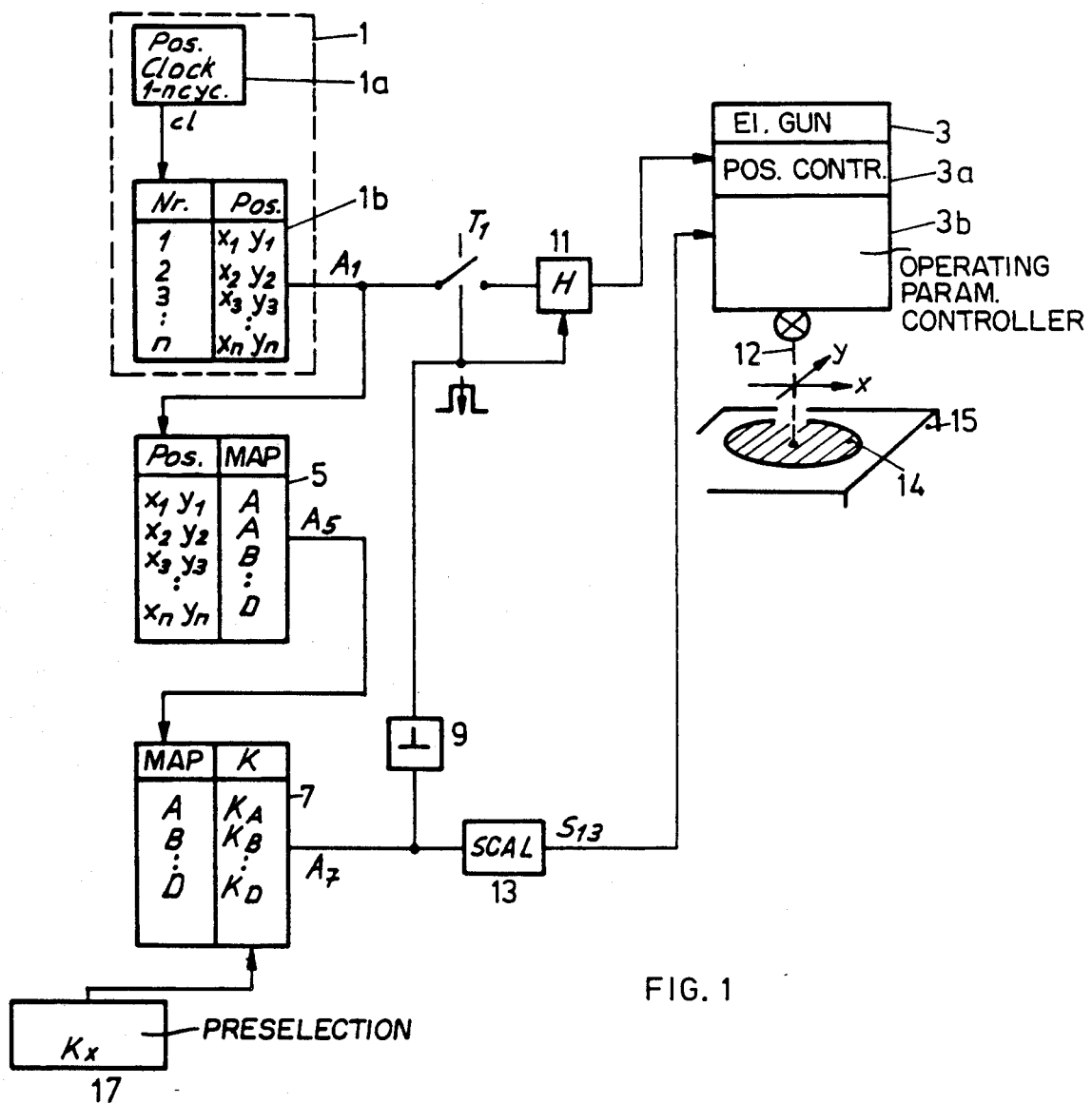
FIG. 1 a combined signal flow/functional block diagram of a first embodiment of the inventive control arrangement operating according to the inventive method, FIG. 2 schematically the assignment of the area to be evaporated to a position pattern for beam movement control and to a correction value pattern resulting from annular shaped maps, FIG. 3 a further embodiment of the inventive control arrangement, processing according to the inventive method, performing optimum movement trajectory search for the beam, FIG. 4 departing from the inventive control arrangement according to FIG. 1 a further embodiment of the invention with several map assigning and correction value storages, whereby the embodiment shown in this figure may be combined with features of the embodiment according to FIG. 3 for additionally optimum beam trajectory search, FIGS. 5a-1 and FIGS. 5a-2, taken together, and FIGS. 5b-1 and 5b-2, taken together, respectively show two further correction value patterns defined by according values within the correction value storages which are realized by bar-shaped or sickle-shaped maps.

In FIG. 1 there is shown a combined signal flow/ function block diagram of a first embodiment of the invention.

A deflection control unit 1 comprises a position clock 1a as well as a position storage 1b. In the simplified example shown, the electron beam 12 evaporates an area to be evaporated on the surface of a crucible 15 and is generated by an electron beam gun 3. The position of the beam for evaporating the surface of the crucible 15 shall be, in this simplified example, subdivided into a pattern of n discrete positions.

Within the position store 1b, the x and y coordinate values of the beam positions, to which the beam shall be moved, are stored together with a number assigned to each such position coordinate couple and shown by the numbers 1 to n. Following the sequence of their number 1 to n, the x and y coordinate values of the beam position are output at an output $A_1$. The position clock 1a controls by means of its output cl circulatingly the position storage 1b, so that the latter one generates at its output $A_1$ sequentially the x and y values according to locations on the crucible surface on which the beam 12 shall impinge. The x and y values output from the position store 1b are therefore led to position control input 3a of the electron beam gun 3.

Every time the position clock activates a next position coordinate pair x, y at the output $A_1$ of the position storage 1b of the deflection control unit 1, a feed-through switching unit $T_1$ is first kept open. The position signals according to x, y appearing at the output $A_1$ are led to a map assigning storage 5. Within the map assigning storage 5 for each of the n beam positions x, y, map identification flags A, B ... are assigned, whereby one and the same flag is assigned to several positions x, y. Thus, the map assigning storage 5 comprises significantly less map identification flags A, B ... than beam position coordinates which are output by the deflection control unit 1. By feeding a beam position coordinate pair x, y from the output $A_1$ to the map assigning storage 5, the map identification flag which belongs to that specific beam position coordinate pair is output at the output $A_5$ of the map assigning storage 5.

The map identification flag which now appears at the output $A_5$ of the map assigning storage 5 is led to a correction value storage 7, wherein a respective correction value $K_A$, $K_B$ ... is stored for every map identification flag A, B ... Thus, according to the map identification flag appearing at the output $A_5$ the correction value storage 7 emits at its output $A_7$ the respective correction value $K_A$, $K_B$ ... etc.

Thus, with a still open feed-through switch unit $T_1$, there appears at the output of the correction value storage 7 a correction value K which is assigned to a position coordinate pair which latter defines a real beam position by x-and y coordinate values which is next to be reached by the electron beam. The correction value K belongs to that map A, B ... respectively, to which the said position belongs. The map assigning storage 5 assigns or defines which position belongs to which map A, B etc. To every map one single correction value K is assigned to, as defined within correction value storage 7.

By emitting the correction value K at the output $A_7$ of the correction value storage 7 and by means of an impulse generator 9 generating a single pulse, the feed-through switching unit $T_1$ is now closed, so that the position coordinate signals x, y, which still stand at the output $A_1$ of the deflection control unit 1 are led via a hold unit 11 which is enabled by means of the impulse generator 9 to the position control 3a of the electron beam gun 3.

The correction value K on its side is led, scaled or amplified by a scaling unit 13, as a control signal $S_{13}$ to an operating parameter controller unit 3b, at which the said control signal $S_{13}$ controls an operating parameter for the electron beam gun 3. Such parameters are preferably the time-span during which the electron beam 12 will remain at a position according to the x, y values on the area to be evaporated 14 as of the crucible, or will be the focus of the beam, i.e. the cross-sectional area of the beam on said area or the power of the beam.

The electron beam 12 will then impinge on the surface 14 at the position to which it is controlled, whereas the feed-through switching unit $T_1$ is again opened.

With the searching and assigning process just described, i.e. first selecting the next position number, then and accordingly the next position, then of the next map identification flag and finally of the next correction value, the setting at the next beam position which shall be worked is prepared. The position clock 1a switches circulatingly through the position numbers 1 to n, so that the area 14 to be evaporated is repeatedly worked by the electron beam.

With the help of a preselection unit 17, the correction values K within the correction value storage 7 may be adjusted or preselected. Preferably they are adjustable departing from a prestored "working point" which latter is prestored within the correction value storage 7.

At the realization of the inventive control arrangement presently used, the operating parameter which is controlled by the operating parameter controller 3b is the time-span during which the beam 12 remains stationary on the respective positions on surface 14.

The presently used electron beam gun is an electron beam gun of known construction as e.g. an electron beam gun ESQ 200 of Balzers AG, Fürstentum Liechtenstein.

Figure 2:
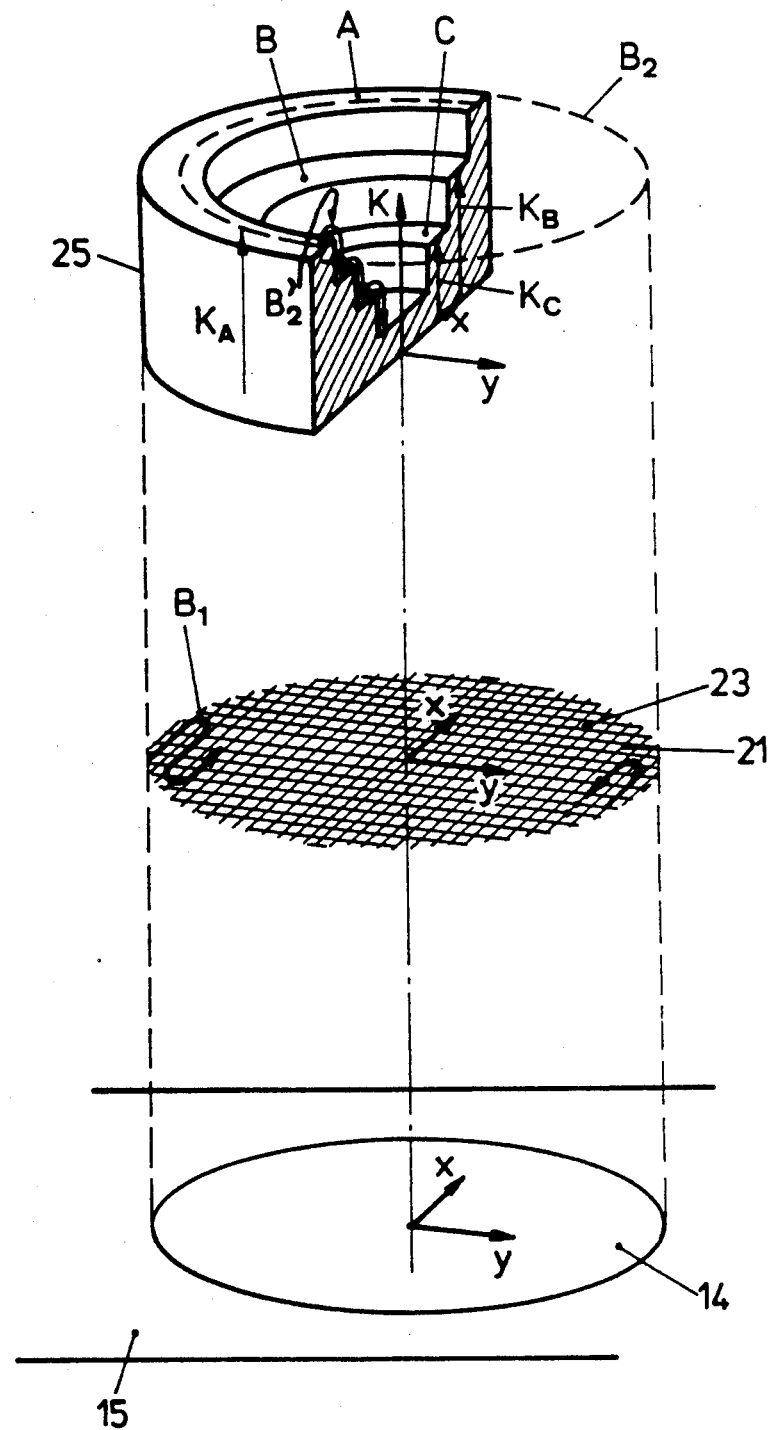

With the help of FIG. 2 the inventive procedure shall once again be explained as performed by the embodiment of the inventive control arrangement of FIG. 1. Again, reference number 14 refers to an area to be evaporated, e.g. in a crucible 15. There is assigned to the area 14 to be evaporated a position pattern 21 for the electron beam 12. This position pattern is divided in a multitude of equal position elements 23, to which the electron beam 12 may be moved. As may be seen, the position pattern 23 approaches with diminishing size of the elements a continuous "pattern", i.e. in this case the beam may continuously be moved into every position with respect to area 14.

Independent from the trajectory on which continuously or step by step the beam 12 is moved with respect to the area 14 to be evaporated, there is assigned to every position of the beam 12 relative to area 14 which positions accord to respective x, y coordinate values, a correction value K. Thereby it must be emphasized that the same correction value K is assigned to a multitude of beam positions according to a multitude of x, y coordinate values, because a multitude of such positions is assigned to the same map A, B ... Thus, the expression "map" as used throughout the present description, is an area of several position elements and therefore is assigned to a predetermined region of the area 14, which several positions of that area being assigned the same correction value K.

It may be seen that e.g. according to FIG. 2 all beam positions which lay on an outside peripheral and annular map A are assigned to the one correction value $K_A$. A correction value $K_B$ is assigned to all beam positions which lay within a radially adjacent concentric ring map B and further correction values $K_C$ etc. are assigned to the further radially adjacent concentric ring maps C . . .

Whereas the correction values K according to FIG. 1 are preferably adjustable, the position to map assignment is preferably predetermined.

This would mean in FIG. 1 that the storage 5 is e.g. construed on the basis of a ROM, PROM or EPROM.

Within the position pattern 21 of FIG. 2, there is shown a first kind of beam trajectory with respect to area 14, at $B_1$. If such a trajectory $B_1$ is controlled with the help of the deflection control unit 1 according to FIG. 1, then the electron beam 12 will follow on the area 14 a regularly zigzagging trajectory.

Now, if this trajectory $B_1$ is laid on the correction value pattern 25, it becomes evident that the control signal $S_{13}$ of FIG. 1, which accords to the respective correction values K, will change quite often, namely every time a change in beam position results in crossing the border of a map A, B or C. As the correction value pattern 25 is known, this unfavourably frequent change of the correction value and thus of the control signal, may be cured in that not a zigzagging trajectory $B_1$ is chosen, but a trajectory which helically starts at the centre and runs towards the periphery of the pattern 25, so that positions of one map are worked after the positions of the other map.

At a predetermined correction value pattern or profile 25, as e.g. shown in FIG. 2, the deflection control unit 1 of FIG. 1 may be operated so as to control the movement of the electron beam to follow a more optimal trajectory as is e.g. shown in FIG. 2 at $B_2$ in dash lines Such an optimized trajectory controls the electron beam first to impinge on positions on the surface 14 which are assigned to a first map A and after all these positions have been worked, to jump to positions assigned to the second map B etc. Such jumps from a position of one map to a position on the next map are shown in FIG. 2 at $B'_2$.

As the correction value pattern is known, it is possible to select a priori a best possible beam movement trajectory, so as to move the electron beam 12 in such a manner that smallest possible steps to change control values must be established and that a changement of control values is necessary as seldom as possible. Nevertheless, in consideration that, according to FIG. 1, individual adjustments of the profile of the correction value pattern 25 is possible by means of adjusting and preselecting unit 17, it becomes apparent that not in every case such a predetermined correction value pattern 25 will be given. Therefore, and as will be explained with the help of FIG. 3, a further embodiment of the invention realizes the option to have such an optimal trajectory automatically searched.

Figure 3:
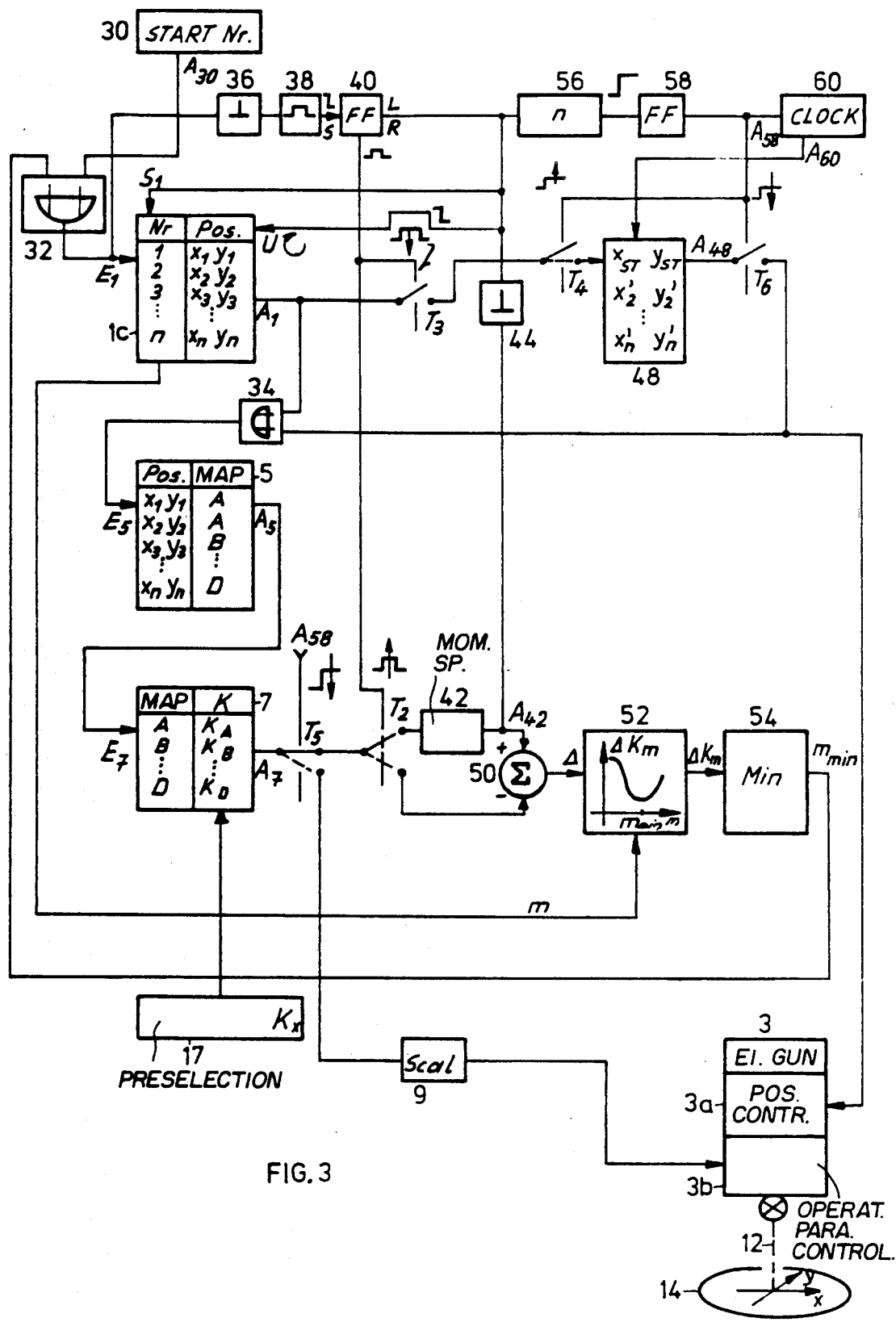

In FIG. 3 function blocks which accord to those which were explained with the help of FIG. 1, are referenced by the same reference numbers.

The control arrangement according to FIG. 3 shall be explained directly by its functioning.

At the beginning, there is set a starting position number of the selection unit 30 at which beam position the trajectory evaluating procedure shall start. The respective position number appearing at the output $A_{30}$ is led via an OR-combination unit 32 to a position storage 1c. Within the position storage 1c the x, y coordinate values of all positions to which the beam 12 may impinge on the area 14, are stored. Respective ones are output at the output $A_1$ in function to inputting the respective position number at input $E_1$ of the position storage 1c.

By means of a signal at a control input $S_1$ of the position storage 1c, the storage content according to the x, y values, whose number is input at input $E_1$, is cleared. By means of a further control signal U the content of the position storage 1c is circulated once, so as to emit at its output sequentially all remaining position value couples x, y not cleared yet.

Analogically to the embodiment of FIG. 1, there appears now at the output $A_1$ position coordinate x, y which accord to the starting number, and these x, y values are led via an OR-combination unit 34 to the input $E_5$ of the map assigning storage 5. Thereupon the latter emits a map flag A, B . . . at its output $A_5$ according to the position values x, y applied to its input $E_5$. The map flag is now fed from the output $A_5$ to the input $E_7$ of the correction value storage 7 which emits the according correction value $K_A$ or $K_B$ . . . at its output $A_7$, according to the map flag or identification input at its input $E_7$.

At the appearance of the start number at input $E_1$ of the position storage 1c, an impulse generator 36 is activated, thereby a time-lag unit 38 and thereby a bi-stable unit 40 as a flip-flop and thereby a switch-over unit $T_2$ which is switched into the position as shown in full line in FIG. 3. Thereby, the correction value which appeared at the output $A_7$ is fed to a momentarily value storage 42. As soon as this correction value is loaded into the momentarily value storage 42 and appears at its output $A_{42}$, the bi-stable unit 40 is reset, e.g. by means of an impulse generator 44 and thus the switch-over unit $T_2$ is switched back into the position shown in dash lines.

The output impulse of the impulse generator 44 is further led to the clearing input $S_1$, so that that content of the storage 1c is cleared, which is still defined by the position number at its input $E_1$. Thus, and as soon a correction value is stored within the momentarily value storage 42, the storage content according to the position number of that stored correction value is cleared from position storage 1c and thus at the beginning first the x, y values of the start position, the according correction value being now stored in storage 42.

This position value now cleared from storage 1c is not lost, previously it was before loaded to an optimal trajectory storage 48. This is accomplished during loading of the according correction value in the momentarily value storage 42, in that a feed-through switching unit $T_3$ was closed, coupled with the action of $T_2$ and a feed-through switching unit $T_4$ was switched in position shown in dash lines. This occurs simultaneously with closing the feed-through switching unit $T_3$ with the output signal of the bi-stable unit 40, which output signal also controls inputting the correction value to storage 42.

After switch-over of the switch-over unit $T_2$ into the dashed line position, the storage content according to the start position number is cleared from position storage 1c, but is stored within optimal trajectory storage 48.

By the impulse of the unit 44, the circulate control input U to the position storage 1c is activated, so that the position storage 1c emits at its output $A_1$ sequentially all remaining x, y position values. Via the OR-combination unit 34, the map assigning storage 5 and the correction value storage 7, a switch-over unit $T_5$ switched in full line position, all correction values K according to all remaining position values within position store 1c are sequentially led to a difference forming unit 50 together with the one correction value which was previously before stored in momentarily value storage 42.

The difference $\Delta$ of the correction values K of respectives of all position values remaining within position storage 1c is input to a difference storage 52 simultaneously with the respective position number m which is retrieved simultaneously from the position storage 1c. Within the storage 52 correction value differences $\Delta K_m$ are stored together with the respective numbers of the positions, the correction values of which were each treated with respect to the correction value stored in momentarily value storage 42.

Thus, after all remaining position values have been emitted at the output $A_1$ of the position storage 1c within the difference storage 52, the following function is stored: Correction value differences of all correction values which are assigned to the position values which remain within the position storage 1c with respect to the correction value assigned to the start position, whereby the correction value differences are stored as a function of the respective position numbers m. This function $\Delta K_m$ which is stored within the difference storage 52 after one circulating cycle of the position storage 1c is led to a minimum detection unit 54 which detects at which position number $m_{min}$ the difference $\Delta K_m$ within difference storage 52 is minimal. The according position number $m_{min}$ is led to the OR-unit 32 and then to the input $E_1$ of the position storage 1c. This newly selected position number acts analogically as did previously the start number which was input for starting the procedure at the output $A_{30}$:

According to the number $m_{min}$ at the input of the position storage 1c there appear the according x, y position values which are led via the OR-combination unit 34 to the map assigning storage 5, the output of which being led to the correction value storage 7, the output of the latter first to the momentarily value storage 42, where the data on the output of the correction value storage 7 is buffered.

The position value output at the output $A_1$ is further led to the optimum trajectory storage 48 as the next position values x2', y2', which values are then cleared from position storage 1c. Then, by circulating the content of the position storage 1c with the still remaining position values, the correction value differences as a function of the numbers of the position values remaining within position storage 1c, are input to storage 52, are then led to the minimum detection unit 54 which detects the next minimum number $m_{min}$ etc.

As becomes evident, there remains within the position storage 1c after each cycle a position number with according position values x, y less, until all position values x, y which were first stored within position storage 1c are stored within the optimal trajectory storage 48, but now in a changed sequence according to the optimal trajectory. The sequence of the positions now stored in the optimal trajectory storage 48 accord to a beam trajectory which results in minimal changes of correction values.

Thus, the position sequence now in storage 48 accords to a beam trajectory for the beam 12 of the electron beam gun 3 at which it is ensured that as the beam propagates from position to position, only minimal correction value steps to change the correction values must be applied.

A counter 56 counts the number of times the momentarily value storage-52 was loaded and sets a bi-stable unit 58 as soon as its count reaches the count n according to the number of beam positions. This shows that the said optimal trajectory is stored in storage 48. Thus, the searching procedure for that optimal trajectory is terminated.

The movement control procedure now started for the beam 12 of the electron beam gun is controlled by the optimal trajectory storage 48. This latter storage replaces now in fact the position storage 1c: The output signal of the bi-stable unit 58 opens the switch-through unit $T_4$ and closes a further feed-through switching unit $T_6$ at the output side of the optimal trajectory storage 48, so that the output $A_{48}$ of that storage is now led to the OR-combination unit 34. Simultaneously, the output $A_{48}$ is led by closing the feed-through switching unit $T_6$ onto the position control input at the electron beam gun 3. Further, by means of the output signal $A_{58}$ of the bi-stable unit 58 the switch-over unit $T_5$ is switched into the position shown in dash lines, so that the output $A_7$ of the correction value storage 7 is led via the scaling unit 9 to the operating parameter controller unit 3b of the electron beam gun 3.

By means of the output signal $A_{58}$ of the bi-stable unit 58, there is further started a clock 60, the output $A_{60}$ of which enabling the position signals from the optimal trajectory storage 48 according to the sequence there were loaded and thus according to the optimal trajectory. Thus, the electron beam of the gun 3 follows that optimal trajectory position-controlled by the position control unit 3a and evaporation controlled via the OR-combination unit 34, the map assigning storage 5 and finally the correction value storage 7. Again, the preferred operating parameter controlled for the beam is the time-span during which it remains at one position or its focussing or its power. This operating parameter or parameters is or are adjusted via the operating parameter controller 3b.

In some cases ambiguities may occur with respect to the minimum which is to be detected at the minimum detection unit 54. In such cases it may be advisable to restrict the number of positions which are to be examined with respect to the correction value difference $\Delta K$. A preferred criterium to restrict the number of such positions is that only correction value differences are formed with respect to positions which are adjacent to or neighbouring each other. The above mentioned ambiguities may occur if different positions lead to the same minimum control value difference.

To provide the above mentioned restriction to positions which are neighbouring an instantaneous beam position, the position storage 1c is not controlled to circulate all the remaining storage content, as a response to the control signal U, but only to circulate those position values which are assigned to position numbers according to neighbouring positions. This means that as soon as there is loaded into the momentarily value storage 42 a correction value according to a position $x_r$, $y_r$, only differences to correction values which accord to the positions according to $x_{r\pm 1}$, $y_r$ and $x_r$, $y_{r\pm 1}$ possibly additionally of the positions $x_{r\pm 1}$, $y_{r\pm 1}$ are examined.

Figure 4:
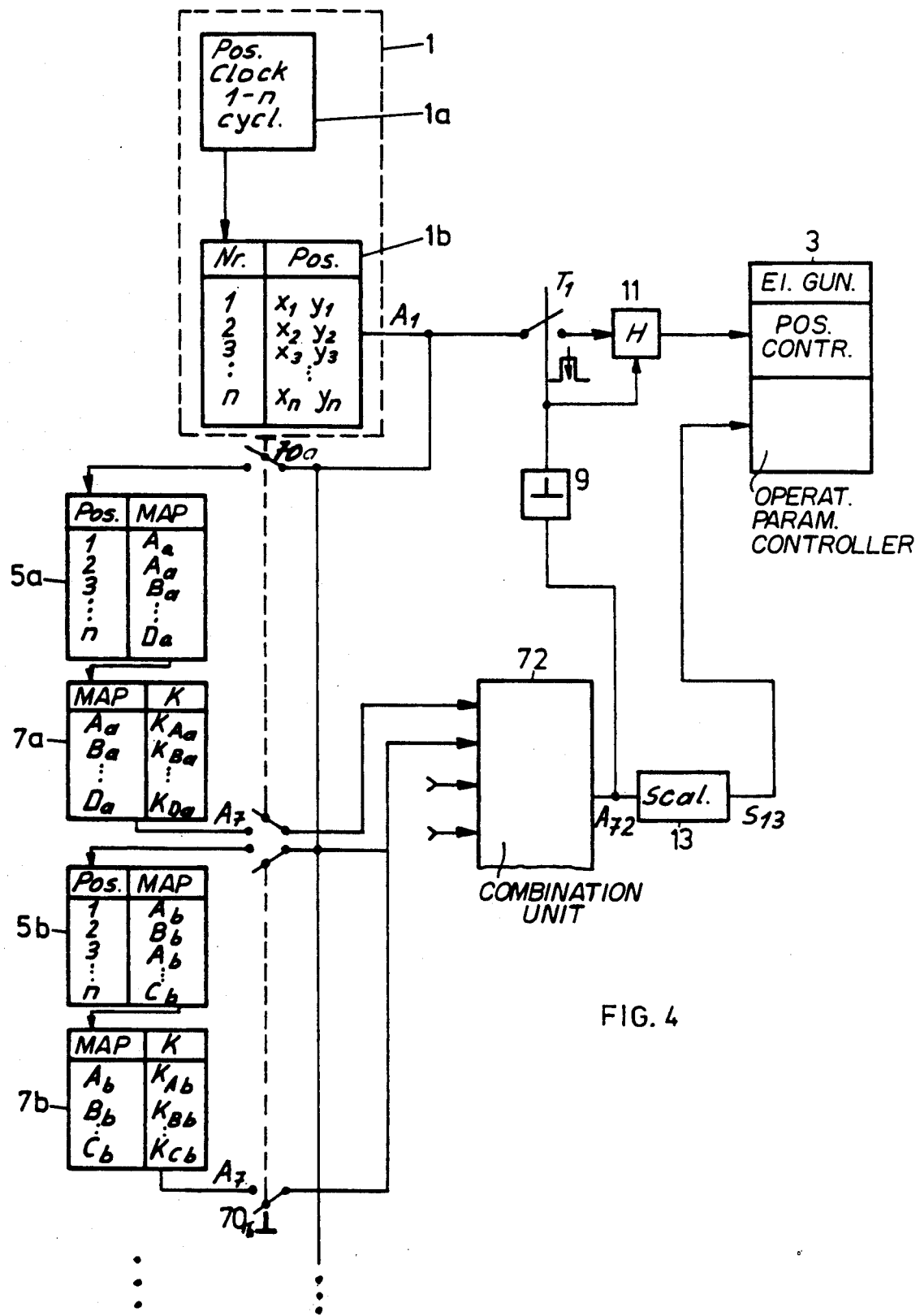

In FIG. 4 there is shown a further embodiment of the inventive arrangement, departing from its configuration according to FIG. 1, i.e. a configuration at which there is installed a predetermined beam trajectory. As may be seen, it may nevertheless be preferred to include the optimal trajectory search option, as was explained with the help of FIG. 3, into the embodiment according to FIG. 4.

Function blocks and signals which accord to those which were already explained with the help of FIG. 1, are referenced to with the same numbers.

According to the embodiment of FIG. 4, the deflection control unit 1 operated as was explained with the help of FIG. 1. It emits at its output $A_1$, clocked by the position clock 1a, the respective position signals x, y.

In this embodiment several sets of map assigning storages and correction value storages assigned to each other 5a/7a, 5b/7b are provided. To all n beam positions x, y in each set different maps with according control values are assigned, so e.g. to the set "a" the maps $A_a$, $B_a$ . . . , $D_a$ and within set "b" the maps $A_b$, $B_b$ . . . $D_b$ with the respective map indication flags, these maps being generally not identical. To these sets specific maps and accordingly correction values K are assigned within the respective correction storages $7_a$ or $7_b$ etc. assigned to those sets.

Two or more than two such map-assignment/correction value-storage-sets are provided which may be individually or in any desired combination used for controlling a specific evaporation process and thus may selectively be activated to gain control over such a process.

Therefore, and as schematically shown, selection switch arrangement 70 is provided. In analogy to the explanations with respect to FIG. 1 on one hand this switch arrangement 70 switches the output $A_1$ of the position storage 1b now and in contrary to the embodiment of FIG. 1, to one or more than one of the map assignment storages $5_a$, $5_b$ . . . according to a specific need. Accordingly, the outputs $A_7$ of one or of more than one of the sets 5/7 provided are switched to a combination unit 72.

At the combination unit 72, all correction values which are output at the according number of activated outputs $A_7$, are combined, whereby such a combination is performed preferably by a weighted addition or by a multiplication, so that at the output $A_{72}$ of the combination unit 72 there appears a signal which is scaled by the scaling unit 13 into the control signal $S_{13}$, which latter is now a function of one or more than one correction values of one or more than one of the activated map-assignment/correction-value-storage-sets 5/7.

In everyone of the sets 5/7 there is stored in analogy to the correction value pattern 25 explained with the help of FIG. 2, a separate correction value pattern which preferably takes the influence of respective physical influences into account with respect to the action of the electron beam 12 on the area 14 to be evaporated. Thus, e.g. within the map-assignment/ correction-value-storage-set "a" the maps and correction values result in an annular map/correction value pattern as was shown in FIG. 2. A correction value pattern with such a profile considers at an axially symmetrical evaporation crucible, the thermal diffusion conditions towards the cooled crucible periphery, which thermal conditions may be represented by annular isothermic lines, thus defining annular maps.

In a second map assignment/correction-value-storage-set "b" map and correction values may be stored which result in a correction value pattern as is shown in FIGS. 5a–7. Such a staircase profile considers the influence of the cross-sectional area with which the beam impinges on the surface area 14 to be evaporated, as the beam is differently deflected, so e.g. a beam which is deflected by an angle up to 270° between leaving the electron beam gun and impinging on the surface 14 to be evaporated. This large angle deflection occurs within a plane which stands perpendicularly on the surface to be evaporated 14, e.g. containing the y-axis.

By means of a further map-assignment/correction-value-storage-set which is not additionally represented in FIG. 4, there is defined a correction value pattern with e.g. a profile according to FIGS. 5b–7. Such a profile with sickle-shaped maps takes into account the influence of lateral deflection of the beam in the X direction on its evaporating action for an electron beam source at which the beam is first deflected up to an angle of 270° after leaving the gun and in a plane perpendicular to the plane of the surface 14 and containing the y-axis.

As shown in FIG. 4, by means of the switching arrangement 70, one selects which of the correction-value patterns or which combination of such patterns shall gain control in a desired evaporation process Thereby, it is once again to be emphasized that one beam position x, y may belong in every set to another map and that, for such a position, from every set a different correction value may be enabled, and that all correction values thus assigned to one position are finally combined at the combination unit 72 to finally result in a composite control signal $S_{13}$ as by additive or multiplicative combination.

This composite control signal considers e.g. one, two or more physical influences on the beam's evaporating action.

Figure 6:
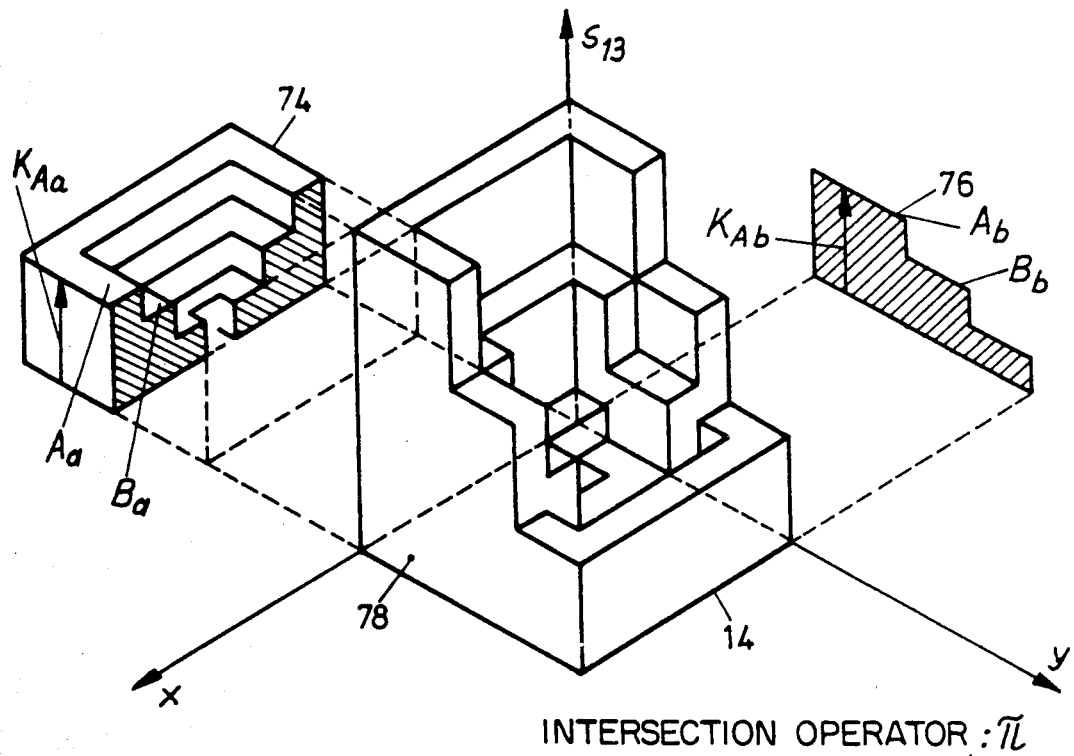
FIG. 6 the distribution of a resulting control value over an area assigned to the area to be evaporated and as is realized by the arrangement according to FIG. 4, if a multiplicative cross-point operator unit is used within a calculation unit, and FIG. 7 the distribution of the control value as is realized by a calculation unit at an arrangement according to FIG. 4 if an additive cross-point operation unit is used.

In FIG. 6 the distribution of the control signal $S_{13}$ is shown as two map-assignment/correction-value-storage-sets 5/7 are activated, whereby with the one set a correction value pattern is defined, with the second set a correction value pattern as shown at 76. If the combination unit 72 of FIG. 4 is principally a multiplication unit, at which the correction values K which are assigned to one position, are multiplied with each other, there results a profile of the control signal $S_{13}$ over the x; y plane, i.e. in fact over the area to be evaporated 14, which is shown in FIG. 6 at 78.

Figure 7:
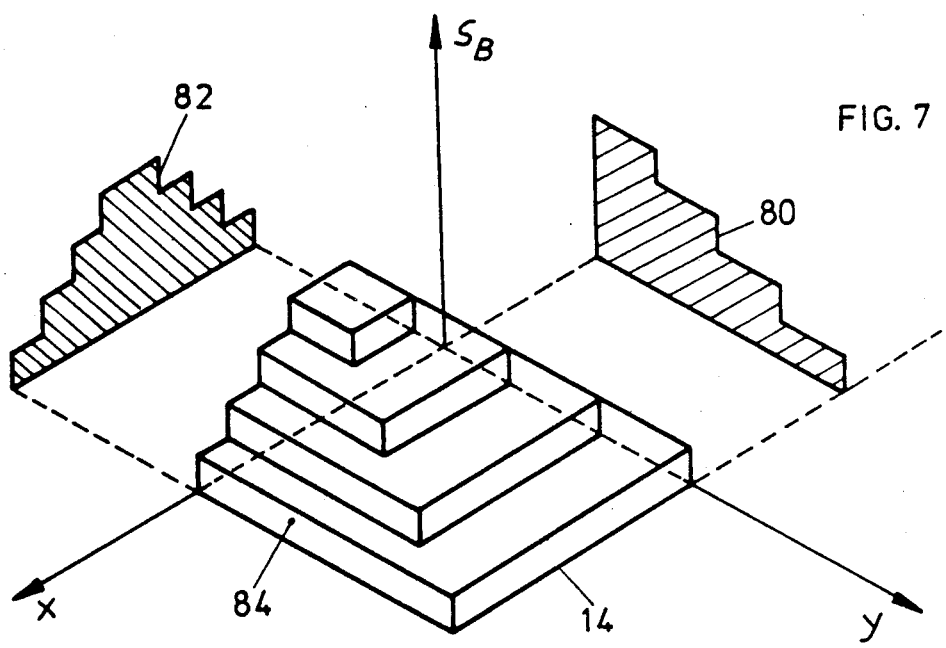

If the combination unit 72 is principally an addition unit, then there results a profile of the composite control signal $S_{13}$ as shown in FIG. 7 at 84 from correction value patterns 80 and 82.

The correction values are preferably first estimated on the basis of physical symmetries as with respect to heat diffusion, and then more accurate values are empirically determined by experiments. Once the correct correction values are found, they are stored and may be used for all further evaporation processes for which they were first found by experiment.

We claim:

1. A method for controlling the average evaporation rate which is produced by an electron beam moved over a predetermined area to be evaporated, so as to result in a predetermined distribution of evaporation rate over said area, comprising the steps of:

assigning to said predetermined area at least two maps with a position pattern each, said position patterns of said at least two maps being assigned to at least a substantial part of said predetermined area, assigning to every position of said position patterns of said at least two maps a correction value, so as to form a correction value pattern as signed to said position patterns of said at least two maps, selecting said correction values to be substantially equal for all positions of the position pattern of respective ones of said two maps, generating from said correction values assigned to every position of said position patterns of said at least two maps control values for every position of said position patterns, moving said beam from position to position on said predetermined area which positions are assigned to said positions of said position patterns of said at least two maps, controlling at least one operating parameter of said electron beam influencing the instantaneous evaporation rate of said electron beam on said predetermined area with said control values, according to its instantaneous position on said predetermined area assigned to an instantaneous position of said position patterns of said at least two maps.

2. The method according to claim 1, further comprising the steps of assigning to at least a part of said predetermined area at least two super-imposed of said maps so that a position of said part of said predetermined area is assigned to a position of said position patterns of said at least two super-imposed of said at least two maps, generating said control value by calculation from correction values assigned to the same position of said position patterns of said super-imposed of said at least two maps.

3. The method according to claim 1, further comprising the steps of assigning to at least a part of said predetermined area at least two super-imposed of said maps, so that a position of said part of said predetermined area is assigned to a position of said position patterns of said at least two super-imposed of said at least two maps, and generating said control values by selectively combining by calculation a predetermined number of correction values, assigned to the same position of said position patterns of said at least two super-imposed of said at least two maps.

4. The method according to claim 1, further comprising the steps of moving said beam from one position to a next position so that said change in position results in a minimum change of said control values.

5. The method according to claim 1, further comprising the steps of predetermining said position patterns assigned to said predetermined area and providing said correction values adjustably.

6. The method according to claim 5, thereby providing predetermined values of said correction values as base values and providing said correction values to be adjustable, departing from said predetermined base values.

7. The method according to claim 1, further comprising the steps of moving said beam from one position to a next position, said next position being adjacent said one position, and selecting said next position from all positions adjacent said one position to have the control value closest to the control value at said one position.

8. The method according to claim 1, further comprising the step of moving said beam from position to position on said predetermined area along a predetermined trajectory.

9. A control arrangement for controlling the evaporation rate of an electron beam on a predetermined area to be evaporated in an evaporation plant, said arrangement comprising a deflection control unit for said beam, generating position identification signals for the position of said beam on said predetermined area, storage means for storing correction values for at least one operating parameter of said beam influencing the evaporation rate of said beam on said predetermined area, assigning means assigning at least a part of said correction values identically to identification signals identifying at least two distinct positions of said beam on said predetermined area, said position identification signals being led to a position control unit for said beam, whereas said correction values being led to a control input for controlling said at least one operating parameter of said beam influencing the evaporating action of said beam on said area to be evaporated.

10. The control arrangement according to claim 9, further comprising a selection unit to which said identification signals are led as well as correction values from said storage means and assigned by said assigning means to position identification signals of said deflection control unit, said selection unit selecting, departing from a position identification signal identifying an instantaneous position of said beam, a subsequent position identification signal, according to a subsequent position for said beam, so that correction values assigned to said subsequent position identification signal differ from said correction values assigned to said instantaneous position identification signal by a minimal amount with respect to all correction values assigned to all of said position identification signals.

11. The control arrangement according to claim 9, further comprising a selection unit to which said position identification signals from said deflection control unit as well as correction values from said storage means and assigned by said assigning means to said position identification signals are led, said selection control unit comparing the correction value assigned to an instantaneous position identification signal according to an instantaneous position of said beam with correction values assigned to other position identification signals of said deflection control unit and according to beam positions adjacent said instantaneous beam position and selecting out of said adjacent position identification signals a position identification signal, the correction value assigned to which differs least from said correction value assigned to said instantaneous position identification signal, said selected position identification signal being led next to said position control unit for said beam.

12. The control arrangement according to claim 9, further comprising additional storage means for storing additional correction values for at least one operating parameter of said beam, said assigning means assigning at least a part of said correction values of said one and of said additional correction values of said additional storage means to a same position identification signal of said deflection control unit, further comprising a calculating unit to which said correction values from said one and additional correction values from said additional storage means being assigned to one of said position identification signals are led, said calculating unit calculating from said correction values a control value, said control value from said calculating unit being led to said control input for controlling said at least one operating parameter as a composite correction value.

13. The control arrangement according to claim 12, wherein said one and said additional storage means are selectively activatable, so as to generate said composite control value by means of a selected number of said correction values out of said selected number of said storage means.

14. The control arrangement according to claim 9, comprising input means to said storage means to externally change said correction values stored within said storage means.

15. The control arrangement according to claim 9, said deflection control unit generating a predetermined sequence of position identification signals for said beam, so as to lead said beam in a predetermined trajectory across said predetermined area to be evaporated.

16. A method for controlling the average evaporation rate which is produced by an electron beam moved over a predetermined area to be evaporated, so as to result in a predetermined distribution of evaporation rate over said area and including a first memory means for storing position data for identifying each position of said area and a control value associated with the position date of each position whereby to respectively move the electron beam to a position according to the position date and to control a predetermined characteristic of the electron beam according to said beam control value, said method comprising the steps of:
  selecting from the memory means the position data of one of said positions and the control value associated therewith;
  sequentially comparing the control value associated with the position data of each position with said selected control value;
  storing in a second memory means the position data of those positions whose control values differ from the initially stored control value by no more than a predetermined amount;
  terminating the scanning of the position data and associated control values when at least a predetermined number of said position data and their associated control values have been compared against the initially selected control value;
  moving said electron beam to follow a predetermined path over said area according to the position data stored in said memory means responsive to the comparison operation; and
  controlling said predetermined characteristic of the electron beam according to the control value initially selected preparatory to the comparison operation whereby said predetermined characteristic of the electron beam being controlled remains substantially constant as the electron beam is moved over said predetermined path.

17. The method of claim 16 wherein the electron beam characteristic being controlled is at least one of the characteristics taken from the group which consists of the size of the electron beam, the dwell time of the electron beam at a data position and the power of the electron beam.

18. The method of claim 16 wherein the second memory means comprises a predetermined portion of said first memory means and the step of storing comprises transferring the position data to the predetermined portion of said first memory means.

19. A control arrangement for controlling the evaporation rate of an electron beam on a predetermined area to be evaporated, said arrangement comprising:
  means for generating an electron beam;
  deflection control means for controlling the position of the electron beam to thereby move the electron beam over the area to be evaporated;
  beam control means for controlling a predetermined characteristic of the electron beam according to a control value applied thereto;
  first storage means for storing the position identification data representative of each position to which the beam may be moved over said area and a control value associated with the position data for each position for controlling a predetermined characteristic of the electron beam which causes said beam to influence the evaporation rate of the area being scanned by said beam;
  second and third storage means;
  means for selecting from said first storage means position data representing one of the positions of said area and the control value associated therewith, said means including means for temporarily storing the position data in said second storage means and for storing the control value associated therewith in said third storage means;
  means for sequentially comparing the control value in the third storage means with the control value associated with the position data for other positions stored in said first storage means;
  means responsive to said comparing means for inserting into said second storage means the position data for those positions whose associated control value differs from the control value stored in said third storage means by no greater than a predetermined amount;
  means for terminating said comparison operation when the position data for at least a predetermined number of positions has been examined;
  means responsive to said terminating means for operating said electron beam deflection means to deflect said electron beam along a path determined by the position data stored in said second storage means; and
  said beam control means controlling said one characteristic of said electron beam according to the value stored in said third storage means, whereby said electron beam characteristic being controlled remains substantially constant as the electron beam scans each of the positions stored in said second storage means.

20. The control arrangement of claim 19 wherein the second and third storage means comprise separate predetermined portions of said first storage means.

21. A method for controlling a characteristic of an electron beam and for controlling the manner in which the electron beam is deflected in order to scan a predetermined surface area which the electron beam impinges upon, said method comprising the steps of:
  (a) storing position data identifying each position of the area to be scanned by the electron beam and storing an associated control value for controlling a predetermined characteristic of the identifying the position to which the electron beam is to be deflected;

(b) selecting the position data of one of the stored positions together with the control value associated therewith;

(c) sequentially comparing each control value associated with the position data of at least a predetermined number of the stored positions with the initially selected control value;

(d) separately storing the position data of those positions whose control values differ from the initially stored control value by no greater than a predetermined amount;

(e) terminating the comparison step (c) when the control values of the predetermined number of position data have been compared with the initially selected control value;

(f) moving the electron beam over said area to those positions represented by the separately stored position data; and (g) controlling said predetermined characteristic of the electron beam according to the control value initially selected preparatory to the comparison operation whereby the characteristic of the electron beam being controlled is substantially the same for each position represented by the separately stored position data.

22. A control arrangement for controlling the movement of an electron beam over a predetermined surface area upon which the electron beam impinges, said arrangement comprising:

means for generating an electron beam;

deflection control means for controlling the position of the electron beam to thereby move the electron beam over said surface area;

beam control means for controlling a predetermined characteristic of the electron beam according to a control value applied thereto;

storage means for storing the position identification data representative of each position to which the electron beam may be moved over said area and a control value associated with the position data for each position for controlling a predetermined characteristic of the electron beam at the location upon the surface area associated with the control value;

means for selecting from said storage means position data representing one of the stored positions and the control value associated therewith, said means including means for temporarily storing the selected position data in a separate position data storage means and for storing the selected control value associated therewith in a separate control value storage means;

means for sequentially comparing the control value in the separate control value storage means with the control values associated with the position data for other positions stored in said first-mentioned storage means;

means responsive to said control value comparing means for inserting into said separate position data storage means the position data for those positions whose associated control value differs from the selected control value by no greater than a predetermined amount;

means for terminating said comparison operation when the control values for at least a predetermined number of positions have been compared with said selected control value;

means responsive to said terminating means for operating said electron beam deflection means to deflect said electron beam along a path determined by the position data stored in said separate position data storage means; and said beam control means controlling said one characteristic of said electron beam according to the control value stored in said separate control value storage means whereby the electron beam characteristic being controlled remains substantially constant as the electron beam scans each of the positions stored in said separate position data storage means.

23. The apparatus of claim 22 wherein said electron beam characteristic being controlled is one of the characteristics taken from the group consisting of beam size, beam power and dwell time of the beam at a position on said surface.

* * * * *

UNITED STATES PATENT AND TRADEMARK OFFICE
CERTIFICATE OF CORRECTION

PATENT NO. : 5,003,151

DATED : March 26, 1991

INVENTOR(S) : Wegmann et al.

It is certified that error appears in the above-identified patent and that said Letters Patent is hereby corrected as shown below:

Column 10, line 19, after "coordinate" insert --values--

Column 10, line 55, "previously it was before loaded" should read --because it was previously loaded--

Column 11, line 13, delete "before"

Figures 1, 5A:
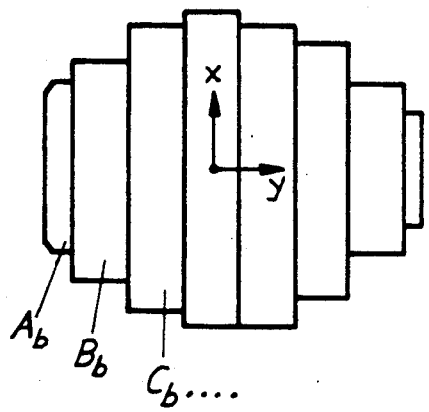
Figures 2, 5A:
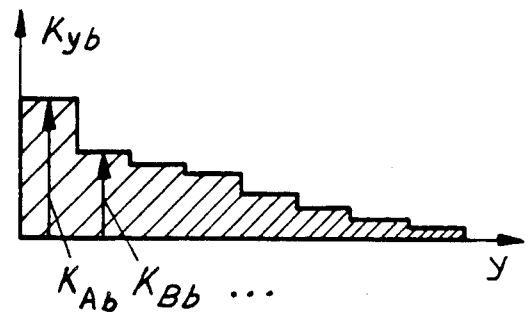

Column 14, line 6, "FIGS. 5a-7" should be --FIGS. 5a-1 and 5a-2--

Figures 1, 5B:
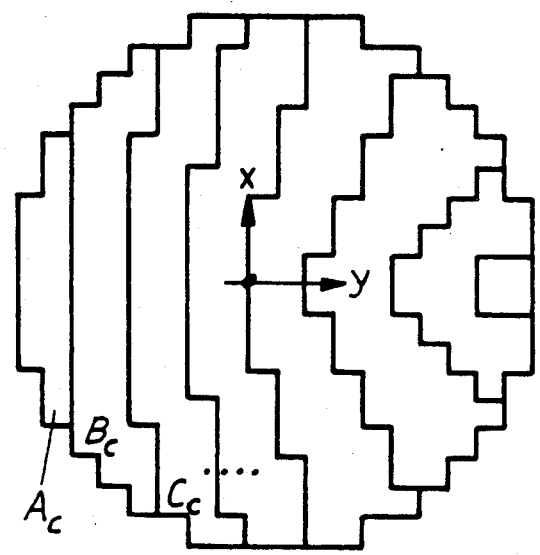
Figures 2, 5B:
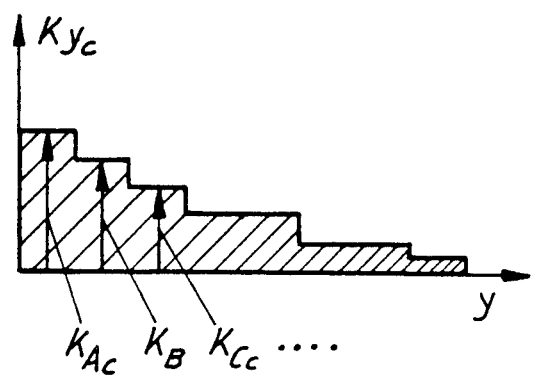

Column 14, line 18, "FIGS. 5b-7" should be --FIGS. 5b-1 and 5b-2--

Column 18, line 68, before "identifying" insert -- electron beam and associating each control value with position date--

Signed and Sealed this

Seventeenth Day of November, 1992

Attest:

DOUGLAS B. COMER

Attesting Officer

Acting Commissioner of Patents and Trademarks